(12) United States Patent
Hudait et al.

(10) Patent No.: US 7,863,710 B2
(45) Date of Patent: Jan. 4, 2011

(54) DISLOCATION REMOVAL FROM A GROUP III-V FILM GROWN ON A SEMICONDUCTOR SUBSTRATE

(75) Inventors: Mantu K. Hudait, Portland, OR (US); Peter G. Tolchinsky, Beaverton, OR (US); Jack T. Kavalieros, Portland, OR (US); Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 229 days.

(21) Appl. No.: 12/032,579

(22) Filed: Feb. 15, 2008

(65) Prior Publication Data

US 2009/0206324 A1 Aug. 20, 2009

(51) Int. Cl.
*H01L 29/20* (2006.01)
(52) U.S. Cl. ...................... 257/615; 257/616
(58) Field of Classification Search ............... 257/615
See application file for complete search history.

(56) References Cited

U.S. PATENT DOCUMENTS

| 5,901,165 | A | * | 5/1999 | Uchida | ................ | 372/45.01 |
| 7,091,108 | B2 | | 8/2006 | Tolchinsky et al. | | |
| 2007/0123003 | A1 | | 5/2007 | Brask et al. | | |

OTHER PUBLICATIONS

Sakai, "MOCVD Growth of III-V compunds on Si using strained superlatticec" Mat. Res Soc. Symp. Proc. vol. 67, p. 15-27.*

Hudait, Mantu K., et al., "Semiconductor Buffer Architecture for III-V Devices on Silicon Substrates", U.S Application filed Aug. 2, 2006 assigned U.S. Appl. No. 11/498,685.

Hudait, Mantu K., et al., "Dislocation-Free INSB Quantum Well Structure on Si Using Novel Buffer Architecture", U.S Application filed Aug. 2, 2006 assigned U.S. Appl. No. 11/501,253.

Hudait, Mantu K., et al., "Stacking Fault and Twin Blocking Barrier for Integrating III-V on Si", U.S Application filed Aug. 2, 2006 assigned U.S. Appl. No. 11/498,901.

Hudait, Mantu K., et al., "SB-Based CMOS Device", U.S Application filed Aug. 16, 2006 assigned U.S. Appl. No. 11/560,494.

Hudait, Mantu K., et al., "Buffer Layers for Device Isolation of Devices Grown on Silicon", U.S Application filed Sep. 27, 2006 assigned U.S. Appl. No. 11/527,785.

Shaheen, Mohamad A., et al., "Thin III-V Semiconductor Films With High Electron Mobility", U.S Application filed Dec. 4, 2006 assigned U.S. Appl. No. 11/633,953.

(Continued)

*Primary Examiner*—Marcos D. Pizarro
*Assistant Examiner*—Eva Yan Montalvo
(74) *Attorney, Agent, or Firm*—Cool Patent, P.C.; Joseph P. Curtin

(57) ABSTRACT

Dislocation removal from a group III-V film grown on a semiconductor substrate is generally described. In one example, an apparatus includes a semiconductor substrate, a buffer film including a group III-V semiconductor material epitaxially coupled to the semiconductor substrate wherein the buffer film includes material melted by laser pulse irradiation and recrystallized to substantially remove dislocations or defects from the buffer film, and a first semiconductor film epitaxially grown on the buffer film wherein a lattice mismatch exists between the semiconductor substrate and the first semiconductor film.

10 Claims, 4 Drawing Sheets

OTHER PUBLICATIONS

Datta, Suman et al., "Insulated Gate for Group III-V Devices", U.S Application filed Dec. 13, 2006 assigned U.S. Appl. No. 11/610,415.

Hudait, Mantu K., et al., "A Buffer Architecture Formed on a Semiconductor Wafer", U.S Application filed Mar. 1, 2007 assigned U.S. Appl. No. 11/712,614.

Chui, Chi O., et al., "Forming a Type I Heterostructure in a Group IV Semiconductor", U.S Application filed Mar. 27, 2007 assigned U.S. Appl. No. 11/728,890.

Chui, Chi O., et al., "Forming a Non-Planar Transistor Having a Quantum Well Channel", U.S Application filed Mar. 27, 2007 assigned U.S. Appl. No. 11/728,891.

Jin, Been Y., et al., "Transistor Having Tensile Strained Channel and System Including Same", U.S Application filed Mar. 29, 2007 assigned U.S. Appl. No. 11/729,564.

Hudait, Mantu K., et al., "High Hole Mobility Semiconductor Device", U.S Application filed Jun. 28, 2007 assigned U.S. Appl. No. 11/823,516.

\* cited by examiner

DISLOCATION REMOVAL FROM A GROUP III-V FILM GROWN ON A SEMICONDUCTOR SUBSTRATE

BACKGROUND

Generally, high-mobility channel materials, such as strained heterostructures are being explored to replace pure silicon in semiconductor devices.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
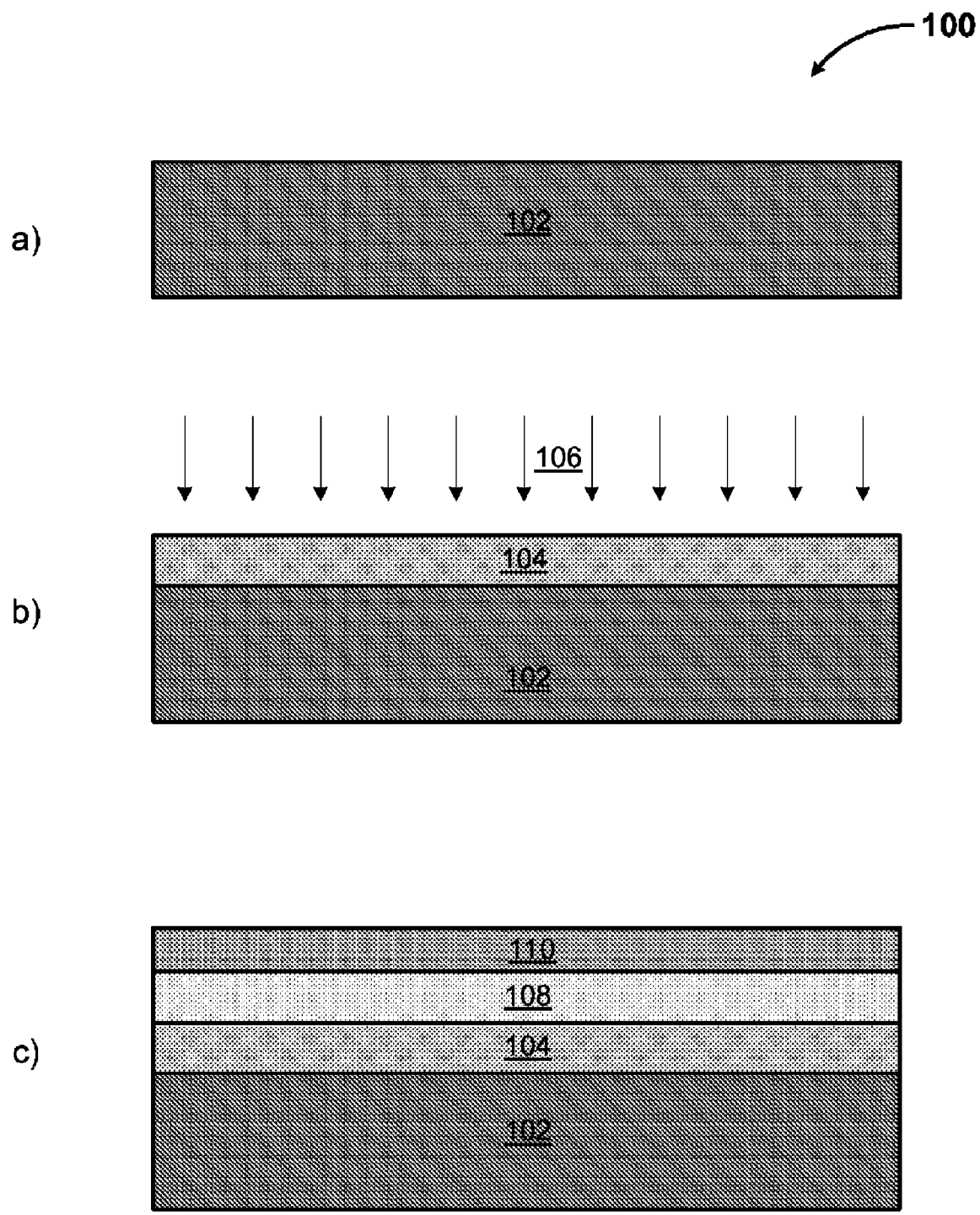
FIGS. 1a-c include a side-view cross-section schematic of dislocation removal from a group III-V film grown on a semiconductor substrate, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of dislocation removal from a group III-V film grown on a semiconductor substrate are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIGS. 1a-c are a side-view cross-section schematic of dislocation removal from a group III-V film grown on a semiconductor substrate. High-mobility channel materials, such as strained heterostructures including group III-V semiconductor materials, are being explored to replace pure silicon in semiconductor devices. However, a lattice mismatch between different materials, such as between a semiconductor substrate 102 and a buffer film 104 or a first semiconductor film 108, may cause dislocation defect pile-up during growth of hetero-epitaxial lattice mismatched materials. For example, when a buffer film 104 is epitaxially deposited on the semiconductor substrate 102, dislocation networks are formed to relax built-up strain between the film and starting substrate materials. A buffer film 104 system may relax the lattice mismatch strain between the substrate 102 and upper layers 108, 110 primarily by the formation of misfit dislocations at the layer interfaces in each step of the graded buffer and subsequent dislocation glide, thereby reducing dislocation densities. The relaxation of strain energy due to lattice mismatch may create misfit dislocations. The creation of threading dislocations due to strain relaxation may detrimentally affect device performance. In one example, relaxation is influenced by both dislocation nucleation kinetics and the rate of dislocation glide. Threading dislocation networks may go through the films 108, 110 without any dislocation gliding for example. Such defects may prevent the reliable integration of quantum-well heterostructures 100 into Si-based complementary metal-oxide-semiconductor field-effect transistor (CMOSFET) platforms, for example. Embodiments disclosed herein may significantly reduce such dislocation defects in quantum-well heterostructures 100. Benefits of such an apparatus 100 include the ability to form substantially dislocation defect-free channel material 108, 110.

In an embodiment according to FIG. 1a, an apparatus 100 includes a semiconductor substrate 102. A semiconductor substrate 102 may include silicon (Si) or any other suitable semiconductor material. In an embodiment, semiconductor substrate 102 is a nonpolar off-oriented silicon substrate. Crystalline materials may have crystalline directions symbolized by the convention (xyz), in which x, y, and z are crystallographic planes in three dimensions that are perpendicular to one another. In an embodiment, semiconductor substrate 102 includes material of a (100) direction off-cut in a range between about 2 degrees to 8 degrees towards a (110) direction. In another embodiment, semiconductor substrate 102 has a high resistivity between about 1 Ω-cm to 50 kΩ-cm.

In an embodiment according to FIG. 1b, an apparatus 100 includes a semiconductor substrate 102, a buffer film 104, and laser-pulse irradiation depicted by arrows 106, each coupled as shown. FIG. 1b may be a depiction of FIG. 1a after epitaxial deposition of buffer film 104 to the semiconductor substrate 102. Epitaxial deposition of buffer film 104 may be accomplished by molecular beam epitaxy (MBE), metal-organic chemical vapor deposition (MOCV). Metalorganic vapor-phase epitaxy (MOVPE), organometallic vapor-phase epitaxy (OMVPE), chemical beam epitaxy (CBE), metal-organic MBE (MOMBE), atomic layer epitaxy (ALE), any suitable deposition method, or combinations thereof.

In an embodiment, a buffer film 104 includes a group III-V semiconductor material epitaxially coupled to the semiconductor substrate 102. A buffer film 104 may include InP, InAs, GaAs, AsP, InGaAs, InGaAsP, or combinations thereof, for example. In an embodiment, buffer film 104 has a thickness between about 0.3 micron and 1 micron.

A buffer film 104 may include material melted by laser pulse irradiation 106 and recrystallized to substantially remove dislocations or defects from the buffer film 104. Recrystallization of the buffer film 104 may take place naturally once the irradiation 106 has ceased. In an embodiment, the laser pulse irradiation 106 has a pulse width between about 3 nanoseconds to 300 nanoseconds, a frequency between about 2 Hz to 5 Hz, and an energy density between about 0.1 J/cm$^2$ to 7 J/cm$^2$. The laser source may be a Nd-doped Yttrium Iron Garnet (Nd:YAG) laser, noble gas halide lasers such as an XeCl excimer laser, or any suitable laser that provides sufficient energy to remove dislocation defects in a buffer film 104 in accordance with embodiments described herein.

Laser-pulse irradiation 106 of the crystalline material of the buffer film 104 may result in melting a damaged surface region of buffer film 104 and improving the stoichiometric homogeneity of the surface region during subsequent recrystallization. Laser-induced 106 recrystallization of the surface region of group III-V semiconductor materials may follow an epitaxial mechanism that improves the structural and material quality by eliminating defects such as dislocations, for example. Regions of a buffer film 104 at a depth considerably greater than the depth of laser radiation 106 absorption and/or the thermal diffusion length may also benefit from reduced defects as a result of generation and propagation of laser-induced 106 stress and shock waves that modify defect and/or material structure. Laser-pulse irradiation 106 may reduce or remove defects that act as sinks, such as dislocations, vacancy clusters, precipitates, small-angle boundaries, twins, or stacking faults, for example.

Laser-pulse irradiation 106 for defect reduction provides a variety of benefits. For example, laser-pulse irradiation 106 may eliminate the need for thermal-cycle annealing, allow for the use of a substantially thinner buffer layer 104, may not involve material removal, may enable very-high throughput in a manufacturing setting, may be a clean process with substantially no pollution or contamination, may modify the surface structure (i.e., remove oxygen vacancies) of high-k dielectric growth on group III-V materials, may activate implanted dopants after ion implantation in semiconductor materials, and so forth. In an embodiment, laser-pulse irradiation 106 completely or nearly completely removes defects and/or dislocations from group III-V buffer layers 104.

In an embodiment according to FIG. 1c, an apparatus 100 includes a semiconductor substrate 102, a buffer film 104, a first semiconductor film 108, and a second semiconductor film 110, each coupled as shown. FIG. 1c may be a depiction of FIG. 1b after a first semiconductor film 108 has been epitaxially grown on the buffer film 104 and a second semiconductor film 110 has been epitaxially grown on the first semiconductor film 108.

In an embodiment, a lattice mismatch exists between at least the semiconductor substrate 102 and the first semiconductor film 108. A lattice mismatch between the semiconductor substrate 102 and the first semiconductor film 108 may be about 4%. In an embodiment, the lattice mismatch is greater than about 3%. The buffer film 104 may provide stress relaxation between at least the semiconductor substrate 104 and the first semiconductor film 108. In an embodiment, the first semiconductor film 108 includes Ge, strained Ge, AlSb, InAlAs, or any other suitable semiconductor material for forming transistor gate structures, or combinations thereof.

A second semiconductor film 110 may be epitaxially coupled to the first semiconductor film 108. In an embodiment, the second semiconductor film 110 includes Si, strained Si, InGaAs, InAs, or InSb, any other suitable semiconductor material for forming transistor gate structures such as low-bandgap and high-mobility materials, or combinations thereof. In another embodiment, the first semiconductor film 108 and the second semiconductor film 110 form a substantially dislocation-free quantum-well heterostructure for use as a channel material in a transistor device. The quantum-well heterostructure 100 may be substantially dislocation-free as a result of laser-pulse irradiation 106 of buffer film 104. For example, a substantially dislocation-free buffer film 104 may reduce or eliminate dislocation gliding in subsequent films 108, 110 coupled with the buffer film 104.

Figure 2:
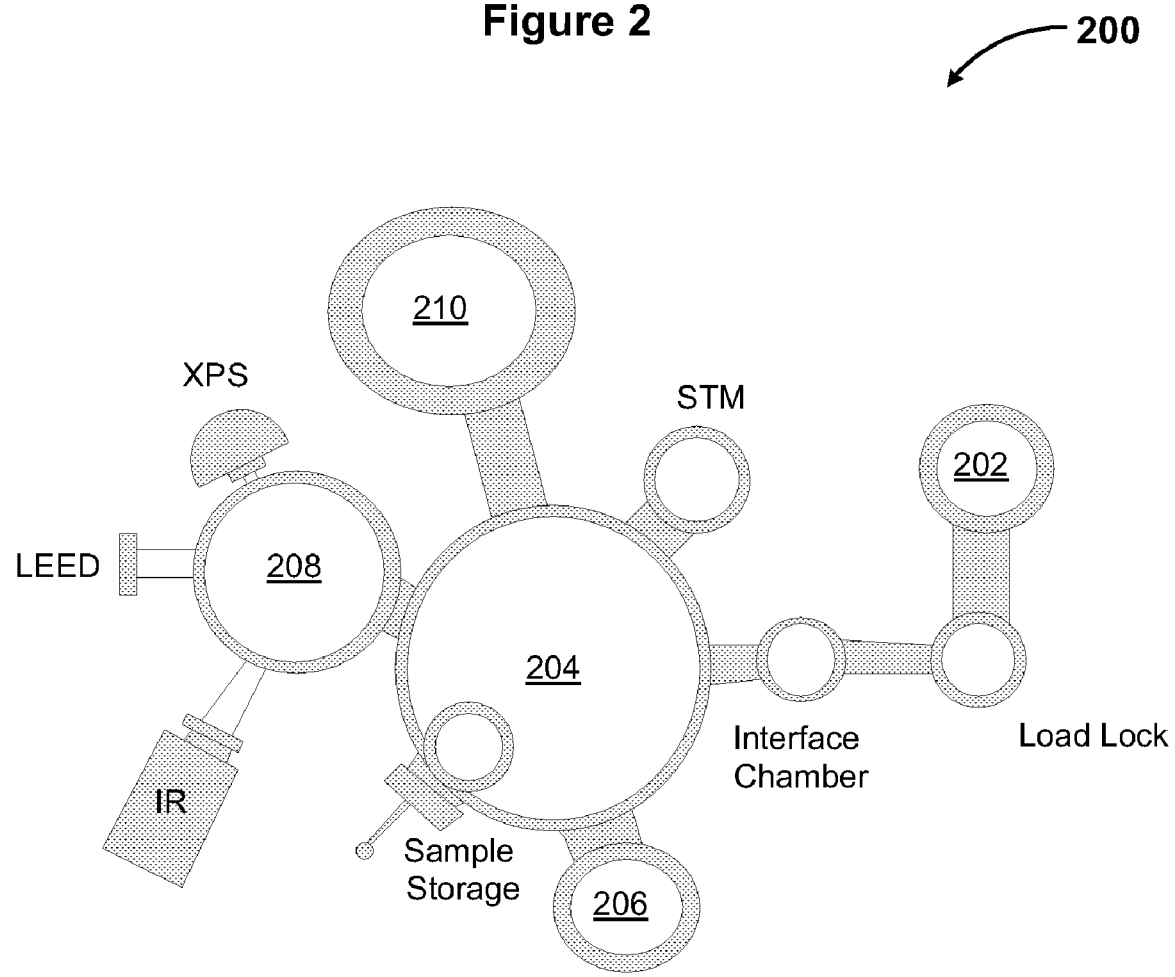
FIG. 2 is an epitaxial deposition system used in dislocation removal from a group III-V film grown on a semiconductor substrate, according to but one embodiment.

FIG. 2 is an epitaxial deposition system used in dislocation removal from a group III-V film grown on a semiconductor substrate, according to but one embodiment. In an embodiment, an epitaxial deposition system 200 includes a first chamber 202, a second chamber 204, a laser 206, a third chamber 208, and a fourth chamber 210, each coupled as shown. In one or more embodiments, an epitaxial deposition system 200 is equipped to provide laser-pulse irradiation 206 to one or more group III-V semiconductor thin films. An epitaxial deposition system 200 may further include features, such as load lock, interface chamber, sample storage, scanning tunneling microscope (STM), x-ray photoelectron spectroscopy (XPS), low-energy electron diffraction (LEED), or infrared spectroscopy (IR). Such features may be arranged or coupled as depicted or may be coupled in a variety of other arrangements.

A first chamber 202 may be a chamber for epitaxial deposition or growth. For example a first chamber 202 may be used to accomplish deposition by molecular beam epitaxy (MBE), metal-organic chemical vapor deposition (MOCVD). Metal-organic vapor-phase epitaxy (MOVPE), organometallic vapor-phase epitaxy (OMVPE), chemical beam epitaxy (CBE), metal-organic MBE (MOMBE), atomic layer epitaxy (ALE), or combinations thereof. Laser 206 annealing or irradiation may be performed inside the first chamber 202 or another chamber associated with the first chamber 202. Laser 206 annealing or irradiation may reduce or eliminate defects and/or dislocations from a group III-V buffer film. The laser 206 source may be a Nd-doped Yttrium Iron Garnet (Nd:YAG) laser, noble gas halide lasers,. such as an XeCl excimer laser, or any suitable laser that provides sufficient energy to remove dislocation defects in a buffer film 104 in accordance with embodiments described herein.

Laser-pulse irradiation 206 may be performed after growth of a group III-V buffer film or during buffer film growth. For example, laser irradiation 206 may be used during GaAs growth on a Si substrate before low-bandgap active transistor films, such as InGaAs are deposited. In one embodiment, a buffer film including GaAs is grown to a thickness of 0.1 micron after which laser irradiation of the buffer film is performed. Such growth and irradiation may be repeated, for example, until a total buffer film thickness of about 0.5 microns is achieved. In another embodiment, a buffer film including GaAs is grown to a thickness of 0.5 microns after which laser irradiation 206 is performed. GaAs is merely an example material and other suitable group III-V semiconductor materials may be used in other embodiments.

Laser-pulse irradiation 206 may accord with embodiments already described with respect to epitaxial deposition system 200 and to be described with respect to method 300 and electronic system 400. In an embodiment, pulsed-laser irradiation 206 uses over pressure of group-V species to protect the film surface from group-V deficiencies.

A second chamber 204 and third chamber 208 may be associated with studying the structural quality of a group III-V semiconductor film, such as a buffer film. Measurement equipments, such as STM, XPS, LEED, and IR, may be coupled to second 204 or third 208 chambers to measure and/or study the group III-V semiconductor films. In another embodiment, various in-situ characterization techniques, such as STM, XPS, LEED, or IR, may be performed without removing a sample outside of a first growth chamber 202. A semiconductor film sample grown on a substrate may be transported back and forth from a first chamber 202 to second 204 and third 208 chambers. In an embodiment, laser irradiation 206 is performed on a group III-V semiconductor film in a second 204 or third 208 chamber.

A fourth chamber 210 may be used for the deposition of a high-k dielectric to group III-V semiconductor films grown on a semiconductor substrate. Such high-k dielectric deposition may be performed without ever removing the sample outside of the epitaxial deposition system 200. In an embodiment, laser irradiation may be performed to modify subsurface structure of group III-V materials and/or to remove oxygen vacancies. Laser irradiation may anneal residual structural imperfections of a group III-V material and/or clean the surface of a group III-V semiconductor film causing a decrease in surface recombination. More or less features or structures may be part of an epitaxial deposition system 200 in other embodiments.

Figure 3:
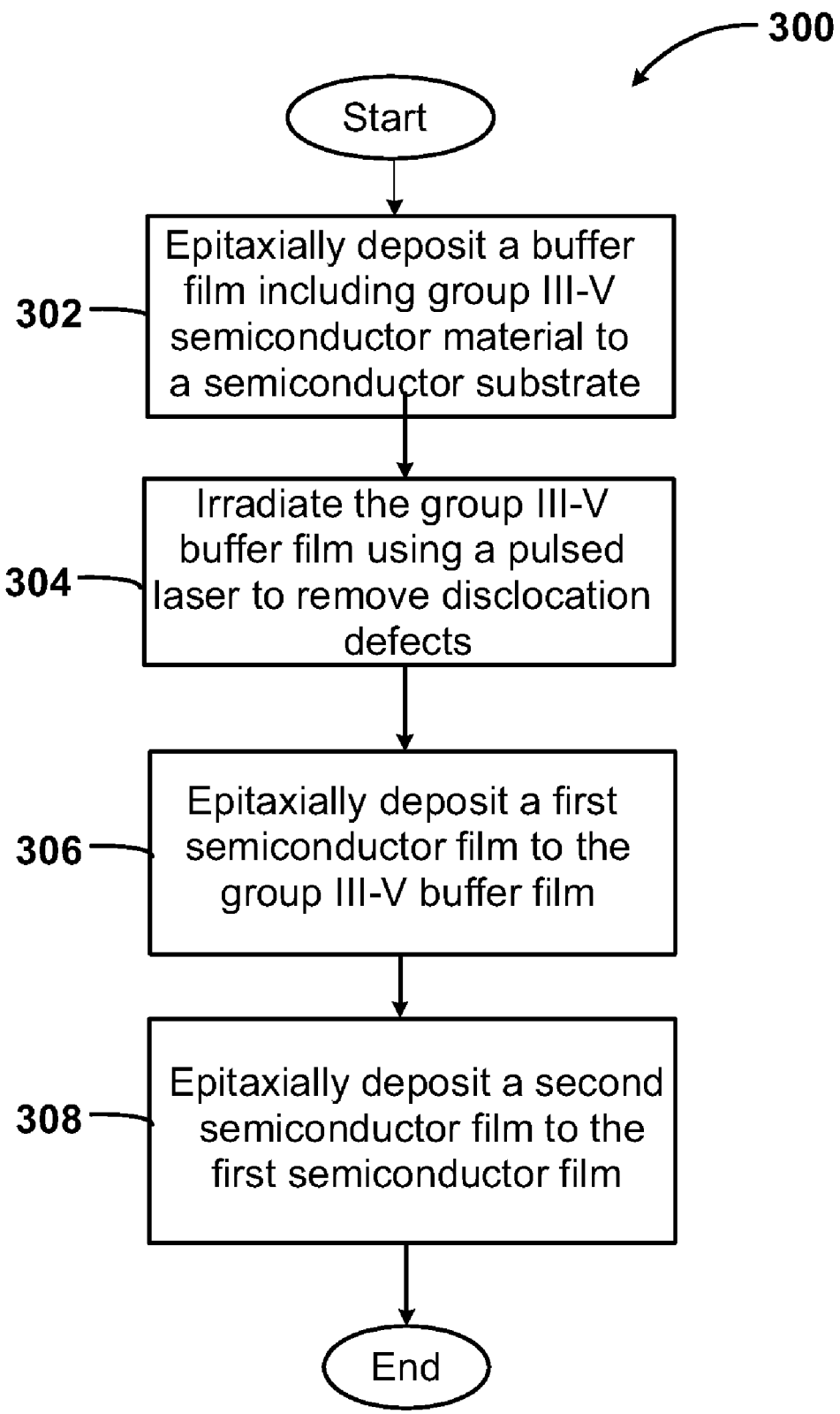
FIG. 3 is a flow diagram of a method for removing dislocations from a group III-V film grown on a semiconductor substrate, according to but one embodiment.

FIG. 3 is a flow diagram of a method for removing dislocations from a group III-V film grown on a semiconductor substrate, according to but one embodiment. In an embodiment, a method 300 includes epitaxially depositing a buffer film including group III-V semiconductor material to a semiconductor substrate 302, irradiating the group III-V buffer film using a pulsed laser to remove dislocation defects 304, epitaxially depositing a first semiconductor film to the group III-V buffer film 306, and epitaxially depositing a second semiconductor film to the first semiconductor film 308.

In an embodiment, a method 300 includes epitaxially depositing a buffer film including a group III-V semiconductor material to a semiconductor substrate 302, irradiating the buffer film with a pulsed laser to substantially remove dislocation or defects from the buffer film 304, and epitaxially depositing a first semiconductor film to the buffer film 306, wherein a lattice mismatch exists between the semiconductor substrate and the first semiconductor film. A buffer film may provide stress relaxation between at least the semiconductor substrate and the first semiconductor film. In one embodiment, a lattice mismatch is greater than about 3% between the semiconductor substrate and the first semiconductor film. In another embodiment, the semiconductor substrate comprises silicon of a (100) direction off-cut in a range between about 2 degrees to 8 degrees towards a (110) direction, the semiconductor substrate having a resistivity between about 1 Ω-cm to 50 kΩ-cm.

Depositing a buffer film 304 may include depositing InP, InAs, GaAs, ASP, InGaAs, or InGaAsP, or combinations thereof. In an embodiment, epitaxially depositing a buffer film 304 includes depositing by molecular beam epitaxy (MBE), metal-organic chemical vapor deposition (MOCVD). Metal-organic vapor-phase epitaxy (MOVPE), organometallic vapor-phase epitaxy (OMVPE), chemical beam epitaxy (CBE), metal-organic MBE (MOMBE), atomic layer epitaxy (ALE), or combinations thereof. Epitaxially depositing a buffer film 302 and irradiating the buffer film 304 may be sequentially repeated until a selected thickness is achieved in the buffer film. In an embodiment, the selected thickness is in the range of about 0.3 micron to 1 micron. Other thicknesses may be selected according to device materials and/or buffering needs between substrates and channel materials.

Irradiating the buffer film with a pulsed laser 304 may include using a pulse width between about 3 nanoseconds to 300 nanoseconds, a frequency between about 2 Hz to 5 Hz, and energy between about 0.1 $J/cm^2$ to 7 $J/cm^2$. In another embodiment, irradiating the buffer film with a pulsed laser 304 melts the buffer film, wherein subsequent recrystallization of the buffer film increases stoichiometric homogeneity and reduces defects or dislocations in the buffer film and wherein irradiating the buffer film 304 occurs prior to epitaxially depositing a first semiconductor film 308.

Epitaxially depositing a first semiconductor film to the buffer film 306 may include depositing Ge, AlSb, or InAlAs, or combinations thereof. In an embodiment, a method 300 includes epitaxially depositing a second semiconductor film to the first semiconductor film 310, the second semiconductor film,. including Si, InGaAs, InAs, or InSb, or combinations thereof, wherein the first semiconductor film and the second semiconductor film form a quantum well. A method 300 may accord with embodiments already described with respect to FIGS. 1-2.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 4:
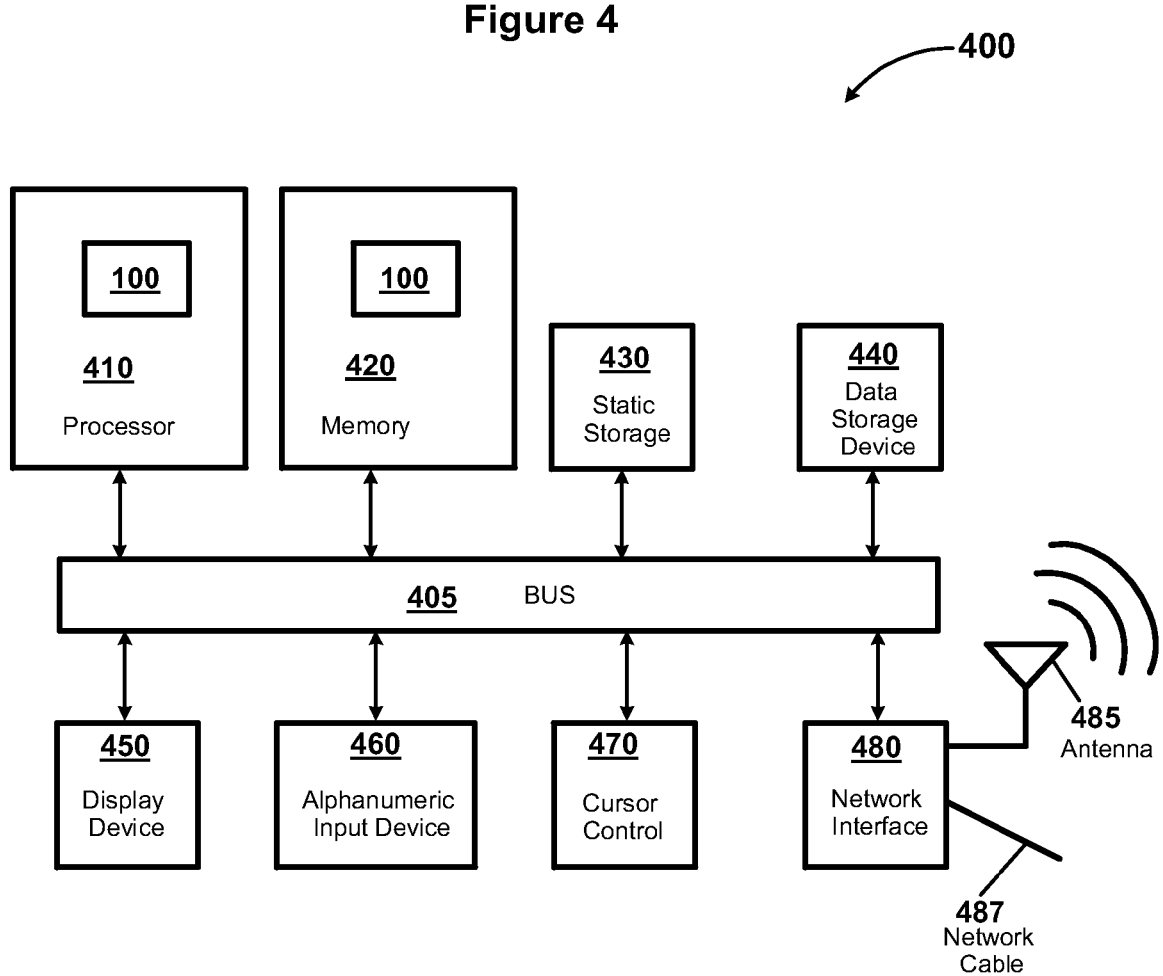
FIG. 4 is a diagram of an example system in which embodiments of the present invention may be used, according to but one embodiment.

FIG. 4 is a diagram of an example system in which embodiments of the present invention may be used, according to but one embodiment. System 400 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 400 includes an apparatus 100 having a group III-V film grown on a semiconductor substrate in accordance with embodiments described with respect to FIGS. 1-3. In an embodiment, an apparatus 100 having a group III-V film grown on a semiconductor substrate as described herein is part of an electronic system's processor 410 or memory 420.

Electronic system 400 may include bus 405 or other communication device to communicate information, and processor 410 coupled to bus 405 that may process information. While electronic system 400 may be illustrated with a single processor, system 400 may include multiple processors and/or co-processors. In an embodiment, processor 410 includes an apparatus 100 having a group III-V film grown on a semiconductor substrate in accordance with embodiments described herein. System 400 may also include random access memory (RAM) or other storage device 420 (may be referred to as memory), coupled to bus 405 and may store information and instructions that may be executed by processor 410.

Memory 420 may also be used to store temporary variables or other intermediate information during execution of instructions by processor 410. Memory 420 is a flash memory device in one embodiment. In another embodiment, memory 420 includes apparatus 100 having a group III-V film grown on a semiconductor substrate as described herein.

System 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled with electronic system 400.

Electronic system 400 may also be coupled via bus 405 to display device 450, such as a cathode ray tube (CRT) or liquid crystal display (LCD), to display information to a user.

Alphanumeric input device 460, including alphanumeric and other keys, may be coupled to bus 405 to communicate information and command selections to processor 410. Another type of user input device is cursor control 470, such as a mouse, a trackball, or cursor direction keys to communicate information and command selections to processor 410 and to control cursor movement on display 450.

Electronic system 400 further may include one or more network interfaces 480 to provide access to network, such as a local area network. Network interface 480 may include, for example, a wireless network interface having antenna 485, which may represent one or more antennae. Network interface 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface 480 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 400 includes one or more omnidirectional antennae 485, which may refer to an antenna that is at least partially omnidirectional and/or substantially omnidirectional, and a processor 410 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus, comprising:
a non-polar off-oriented silicon substrate, the substrate comprising a resistivity between about 1 Ω-cm to 50 Ω-cm, and the substrate comprising material of a (100) direction off-cut in a range between about 2 degrees to 8 degrees towards a (110) direction;
a buffer film comprising InP, InAs, GaAs, AsP, InGaAs, InGaAsP, or combinations thereof epitaxially coupled to the substrate, the buffer film melted by pulsed-laser irradiation and recrystallized to substantially remove dislocations or defects, or combinations thereof, from the buffer film, the buffer film comprising a thickness of about 0.3 micron to about 1 micron, and the laser pulse irradiation comprising a pulse width between about 3 nanoseconds to 300 nanoseconds, a frequency between about 2 Hz to 5 Hz, and an energy between about 0.1 $J/cm^2$ to 7 $J/cm^2$;
a first semiconductor film epitaxially grown on the buffer film, the first semiconductor film comprising Ge, AlSb, or InAlAs, or combinations thereof, the first semiconductor comprising a lattice having a lattice mismatch between a lattice of the substrate, the lattice mismatch is greater than about 3%, and the buffer film providing stress relaxation between at least the substrate and the first semiconductor film; and
a second semiconductor film epitaxially grown on the first semiconductor film, the second semiconductor film comprising Si, InGaAs, InAs, or InSb, or combinations thereof, the first semiconductor film and the second semiconductor film forming a quantum-well heterostructure channel material for a transistor device.

2. An apparatus comprising:
a non-polar off-oriented silicon substrate;
a buffer film comprising a group III-V semiconductor material epitaxially coupled to the substrate, the buffer film comprising material melted by pulsed-laser irradiation and recrystallized to substantially remove dislocations or defects, or combinations thereof, from the buffer film;
a first semiconductor film epitaxially grown on the buffer film, the first semiconductor comprising a lattice having a lattice mismatch between a lattice of the substrate, and the first semiconductor film comprising Ge, AlSb, or InAlAs, or combinations thereof; and
a second semiconductor film epitaxially grown on the first semiconductor film, the second semiconductor film comprising Si, InGaAs, InAs, or InSb, or combinations thereof, the first semiconductor film and the second semiconductor film forming a quantum-well heterostructure channel material for a transistor device.

3. An apparatus according to claim 2, wherein the first semiconductor comprises a lattice having a lattice mismatch between a lattice of the substrate that is greater than about 3%, and
wherein the buffer film provides stress relaxation between at least the substrate and the first semiconductor film.

4. An apparatus according to claim 3, wherein the buffer film comprises InP, InAs, GaAs, AsP, InGaAs, InGaAsP, or combinations thereof.

5. An apparatus according to claim 4, wherein the buffer film comprises a thickness of about 0.3 micron to about 1 micron.

6. An apparatus according to claim 5, wherein the laser pulse irradiation comprises a pulse width between about 3 nanoseconds to 300 nanoseconds, a frequency between about 2 Hz to 5 Hz, and an energy between about 0.1 J/cm$^2$ to 7 J/cm$^2$.

7. An apparatus according to claim 6, wherein the substrate comprises a resistivity between about 1 Ω-cm to 50 kΩ-cm, and the substrate comprising material of a (100) direction off-cut in a range between about 2 degrees to 8 degrees towards a (110) direction.

8. An apparatus according to claim 2, wherein the buffer film comprises a thickness of about 0.3 micron to about 1 micron.

9. An apparatus according to claim 2, wherein the laser pulse irradiation comprises a pulse width between about 3 nanoseconds to 300 nanoseconds, a frequency between about 2 Hz to 5 Hz, and an energy between about 0.1 J/cm$^2$ to 7 J/cm$^2$.

10. An apparatus according to claim 2, wherein the substrate comprises a resistivity between about 1 Ω-cm to 50 kΩ-cm, and the substrate comprising material of a (100) direction off-cut in a range between about 2 degrees to 8 degrees towards a (110) direction.

\* \* \* \* \*